United States Patent [19]
Fassel et al.

[11] Patent Number: 5,286,920
[45] Date of Patent: Feb. 15, 1994

[54] ELECTRICAL SWITCHING DEVICE

[75] Inventors: Reinhard Fassel, Oberasbach; Hartmut Zoebl, Fuerth; Werner Hofmeister, Muehlacker; Olaf Zinke, Stuttgart, all of Fed. Rep. of Germany

[73] Assignee: Robert Bosch GmbH, Stuttgart, Fed. Rep. of Germany

[21] Appl. No.: 954,912

[22] Filed: Sep. 30, 1992

[30] Foreign Application Priority Data

Nov. 16, 1991 [DE] Fed. Rep. of Germany ....... 9114287

[51] Int. Cl.⁵ .............................................. H05K 5/02
[52] U.S. Cl. ..................................... 174/51; 361/752; 439/76
[58] Field of Search ................ 174/51, 52.1, 261, 267; 361/399, 415; 439/76

[56] References Cited

U.S. PATENT DOCUMENTS 4,409,641 10/1983 Jakob et al. ..................... 361/399 X
4,823,235 4/1989 Suzuki et al. ..................... 361/399 X Primary Examiner—Lincoln Donovan
Assistant Examiner—D. A. Tone
Attorney, Agent, or Firm—Michael J. Striker

[57] ABSTRACT

An electrical switching device has a housing composed of an electrically conductive material, at least one conductor plate having a region of an electrically conductive material and arranged in the housing, plug connection means extending from the housing in a sealed manner, and an element for electrically conductive connection of the conductor plate with the housing. The element for electrically conductive connection includes a mechanically prestressed spring element. The spring element has one end abutting against the conductor plate in the region of an electrically conductive material and another end fixedly connected with the housing.

9 Claims, 1 Drawing Sheet

ELECTRICAL SWITCHING DEVICE

BACKGROUND OF THE INVENTION

The present invention relates to an electrical switching device which is used in practice.

More particularly, it relates to an electrical switching device which has an electrically conductive housing, at least one conductor plate located in the housing and provided with conductor paths and electrical structural elements, and plug connection parts passing from the housing in a sealed manner.

In a known electrical switching device a mass spring is soldered on the lower side of the conductor plate and has an end abutting against the inner wall of the housing. This design is however not sufficiently suitable for an automatic series production. In each individual switching device the mass spring is soldered manually on the conductor plate. Thereby the switching device is very expensive. A mass contact for the conductor plate is also required, for increasing the electromagnetic compatibility and for avoiding disturbances of the radio reception from the control device. In individual cases it is for example possible that the transmitter search of an outer radio in a motor vehicle receives the disturbing radiation extending from the switching device as beams of a radio transmitter. Further, it is prescribed in accordance with law regulations to avoid the disturbing radiations of this type.

SUMMARY OF THE INVENTION

Accordingly, it is an object of the present invention to provide a switching device of the above mentioned general type, which avoids the disadvantages of the prior art.

In keeping with these objects and with others which will become apparent hereinafter, one feature of the present invention resides, briefly stated, in an electrical switching device which has an electrically conductive housing, at least one conductor plate arranged in the housing and having conductor paths and electrical structural elements, plug connection parts passing from the housing in a sealed manner, wherein the conductor plate is connected with the housing by an electrically conductive connection composed of a mechanically pre-stressed spring element, one end of the spring element abuts against the conductor plate in a region composed of an electrically conductive material while the other end of the spring element is mounted in a form-locking manner or mechanically on the housing.

When the switching device is designed in accordance with the present invention, no expensive manual soldering is needed. The switching device can be produced in simple and automatic process in series production. During production of individual parts the mass spring can be mounted on the housing. Since the mass spring is located on the housing, various mounting processes can be used such as for example welding, riveting, etc., and they can be performed in an automatic procedure.

In accordance with another feature of the present invention, the end of the spring element is mounted on the housing by riveting. It can be also mounted on the housing by welding. The end of the spring element can be also soldered to the housing. Finally, the end of the spring element is folded so that it engages the free end of the housing wall.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF THE PREFERRED EMBODIMENTS

Figure 1:
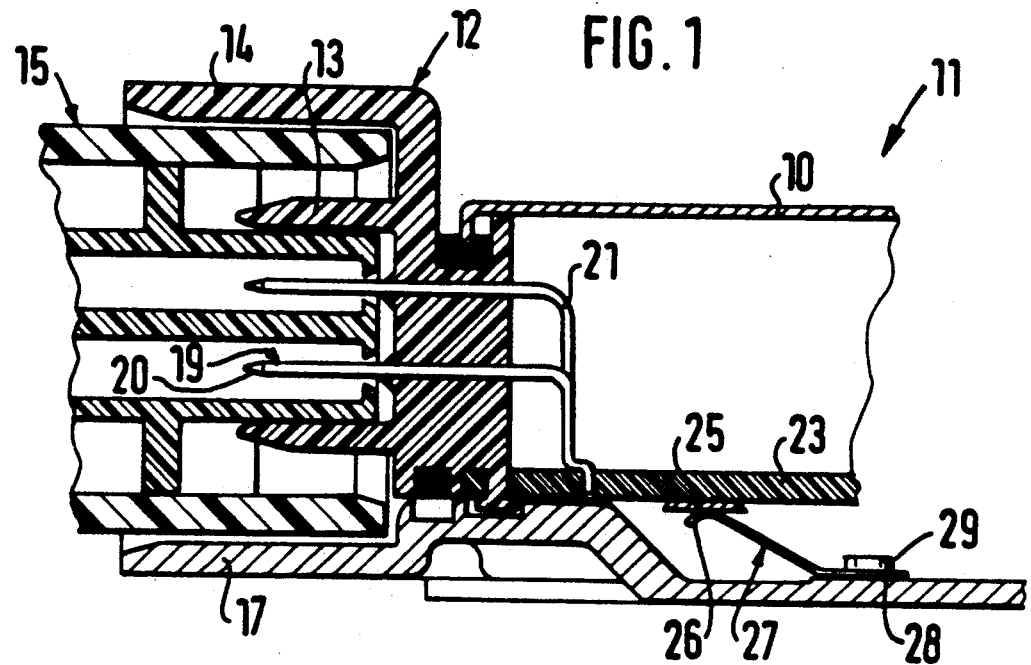
FIG. 1 is a view showing a longitudinal section of the switching device in accordance with the present invention, in the region of a plug strip.

A switching device is identified as a whole with reference numeral 11 and has a housing which is partially shown in FIG. 1 and identified with reference numeral 10. The housing is composed of an electrically conductive material, for example sheet metal or steel. A plug strip 12 is arranged in a side wall of the housing 10, for example in its front wall. The plug strip 12 is composed of an isolating synthetic plastic.

The plug strip 12 has an inner guiding edge 13 and an outer guiding edge 14 for a partially shown counter plug 15. The outer guiding edge 14 of the plug strip 12 is partially formed by a projection 17 of the housing 10. A plurality of flat plugs 19 are sealingly embedded in the plug strip 12 in the region between the inner guiding edges 13. The flat plugs 19 arranged in two rows extend with their plug portion 20 into the receiving body of the counter plug 15. The other end of the flat plug 19 is formed as a connecting tongue 21 and soldered on an associated conductor path of a conductor plate 23. Instead of a conductor plate, also a hybrid plate can be used.

On the lower side of the conductor plate 23 or in other words on the side which is opposite to the conductor paths, a region 25 of an electrically conductive material is applied. The region 25 extends over the whole width of the conductor plate 23. The switching device is provided with a mechanically prestressed bending spring 27. The bending spring 27 has one end 26 which is located in the region 25, and another end 28. The end 28 of the bending spring 27 is mounted on the housing 10 by means of a rivet connection 29. Due to this rivet connection, the end 28 of the bending spring 27 has a fixed, immovable connection with the housing 10, while the other end 26 due to the mechanical prestressing of the bending spring 27 in the region 25 just abuts against the conductor plate 23. Instead of a rivet connection, the end 28 of the bending spring 27 can also be soldered or welded to the housing. These types of mounting can be performed in automatic processes.

The bending spring 27 has the object of carrying away a disturbing current from and to the conductor plate 23 through the housing 10. Due to the above described special design of the housing 10 with the bending spring 27 it is possible during the manufacture of parts to fixedly mechanically connect the bending spring 27 with its end 28 to the inner side of the housing. If during the end mounting the plug strip 12 with the conductor plate 23 is inserted in the housing 10, the bending spring 27 can slide along the lower side of the conductor plate 23 and, in finally mounted condition of the switching device, abut against the conductor plate 23 in the region 25 with a predetermined pressure due to the mechanical prestress of the bending spring.

Figure 2:
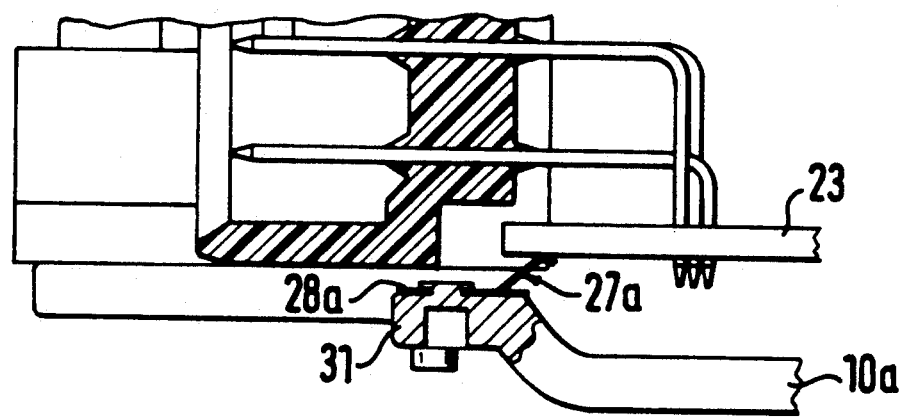
FIG. 2 is a view substantially corresponding to the view of FIG. 1, but showing a modification of the invention.

In the switching device of FIG. 2, in deviation from the switching device of FIG. 1, a housing 10a has an end portion 31, and an end 28a of a bending spring 27a is connected with the housing 10a. In this way both a mechanically fixed connection and an electrically conductive connection of the bending spring 27a with the housing 10a is produced.

Figure 3:
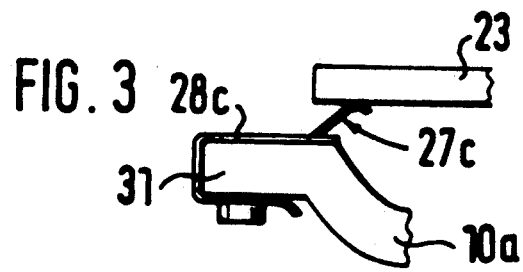
FIG. 3 is a view showing a detail of the inventive switching device.

In the switching device in accordance with the embodiment shown in FIG. 3, an end 28c of a bending spring 27c is bent around an end 31 of the housing 10a so as to engage the end. It can be displaced onto the end 31 and engage it in a form-locking manner. This embodiment provides for an especially simple design which is suitable for automatic production.

It will be understood that each of the elements described above, or two or more together, may also find a useful application in other types of constructions differing from the types described above.

While the invention has been illustrated and described as embodied in an electrical switching device, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. An electrical switching device, comprising a housing composed of an electrically conductive material; at least one conductor plate having a region of an electrically conductive material and arranged in said housing; plug connection means extending from said housing in a sealed manner; and means for electrically conductive connection of said conductor plate with said housing, said means for electrically conductive connection including a mechanically prestressed spring element, said spring element having one end abutting against said conductor plate in said region of an electrically conductive material and another end fixedly connected with said housing.

2. An electrical switching device as defined in claim 1, wherein said another end of said spring element is form-lockingly connected with said housing.

3. An electrical switching device as defined in claim 1, wherein said another end of said spring element is mechanically connected with said housing.

4. An electrical switching device as defined in claim 1, wherein said conductor plate carries conductor paths and electrical structural elements.

5. An electrical switching device as defined in claim 1; and further comprising a rivet connecting element which connects said another end of the spring element with said housing.

6. An electrical switching device as defined in claim 1; and further comprising a welding element which weldingly connects said another end of said spring element to said housing.

7. An electrical switching device as defined in claim 1; and further comprising a soldering element which solderingly connects said another end of said spring element to said housing.

8. An electrical switching device as defined in claim 1, wherein said another end of said spring element is folded so as to form-lockingly engage a part of said housing.

9. An electrical switching device as defined in claim 8, wherein said housing has a housing wall with a free end which forms said part of said housing, said folded another end of said spring element form-lockingly embracing said free end of said housing wall.

* * * * *